(12) United States Patent
Brown

(10) Patent No.: US 7,706,553 B2
(45) Date of Patent: Apr. 27, 2010

(54) AUTO-MUTE COMMAND STREAM BY VOICE-ACTIVATED REMOTE CONTROL

(75) Inventor: William J. Brown, Centereach, NY (US)

(73) Assignee: Innotech Systems, Inc., Port Jefferson, NY (US)

( * ) Notice: Subject to any disclaimer, the term of this patent is extended or adjusted under 35 U.S.C. 154(b) by 1322 days.

(21) Appl. No.: 11/181,684

(22) Filed: Jul. 13, 2005

(65) Prior Publication Data

US 2007/0014420 A1    Jan. 18, 2007

(51) Int. Cl.
| H03G 3/20 | (2006.01) |
| H04R 27/00 | (2006.01) |
| H04R 9/06 | (2006.01) |
| H02B 1/00 | (2006.01) |
| G03B 13/00 | (2006.01) |
| H04N 5/232 | (2006.01) |

(52) U.S. Cl. .................. 381/110; 381/85; 381/123; 381/333; 348/114

(58) Field of Classification Search .................. 381/110, 381/85, 123, 333; 348/114, 462
See application file for complete search history.

(56) References Cited

U.S. PATENT DOCUMENTS 5,267,323 A * 11/1993 Kimura ...................... 381/110
6,747,566 B2 * 6/2004 Hou ........................ 340/825.69

* cited by examiner

Primary Examiner—Vivian Chin
Assistant Examiner—Douglas J Suthers
(74) Attorney, Agent, or Firm—Raymond J. Werner

(57) ABSTRACT

A voice-activated, or voice-operated, remote control is adapted to reduce or eliminate the sound output of one or more entertainment appliances in order quiet the environment and thereby improve the effectiveness and accuracy its voice recognition functions. In one aspect of the present invention, the remote control sends a mute command to an appliance under control and listens for a voice command during an ensuing predetermined time period. In a further aspect of the present invention, the remote control determines which one of a plurality of unmute sequences is to be transmitted.

19 Claims, 7 Drawing Sheets

Voice operated Remote control

AUTO-MUTE COMMAND STREAM BY VOICE-ACTIVATED REMOTE CONTROL

FIELD OF THE INVENTION

The present invention generally relates to improving the audio environment in which a voice-activated product operates, and more particularly relates to reducing or eliminating one or more sound sources in the neighborhood of a voice-activated remote control.

BACKGROUND

Advances in semiconductor manufacturing technologies have led to the integration many individual circuit elements on integrated circuits. In turn, this capability has provided designers with the opportunity to create a wide range systems and system-level components that are suitable for use in consumer electronic products offering a variety of sophisticated features.

Consumer electronic products including but not limited to televisions (TV), are commonly made to operate with wireless remote controls. As is well known, such remote controls, when operated by a user, send various commands to a TV, or similar entertainment appliance, to control functions such as power-on, power-off, volume-up, volume-down, mute, channel-up, channel-down, and so on. More recently, the aforementioned advances have allowed features such as speech recognition and speech synthesis to be cost effectively integrated into consumer electronic devices such as remote controls.

When voice recognition functionality is included in a remote control, it is possible to instruct, via voice command, the remote control to send one or more signals to a correspondingly controlled entertainment appliance, such as a TV, so as to control that appliance.

What is needed are methods and apparatus for increasing the effectiveness and accuracy of voice recognition by voice-activated electronic products.

SUMMARY OF THE INVENTION

Briefly, a voice-activated, or voice-operated, remote control is adapted to reduce or eliminate the sound output of one or more entertainment appliances in order quiet the environment and thereby improve the effectiveness and accuracy its voice recognition functions.

In one aspect of the present invention, the remote control sends a mute command to an appliance under control and listens for a voice command during an ensuing predetermined time period.

In a further aspect of the present invention, the remote control determines which one of a plurality of unmute sequences is to be transmitted to the appliance which was previously muted.

DETAILED DESCRIPTION

Figure 1:
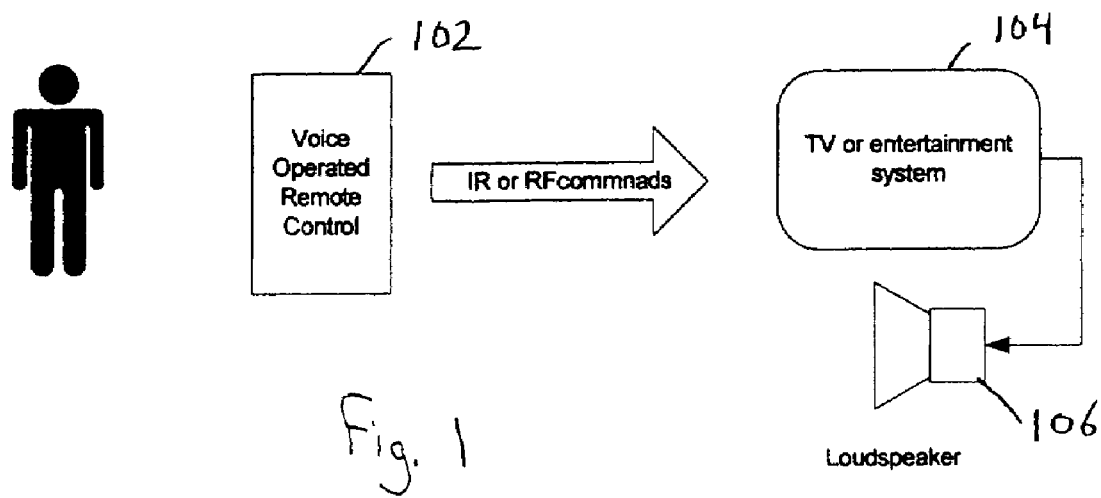
FIG. 1 is a high level block diagram of a system including a voice-operated remote control, in accordance with the present invention, in wireless communication with a sound producing entertainment system.

Generally, embodiments of the present invention provide for reducing or eliminating undesired background sounds so that a voice-activated product can more effectively receive, and accurately interpret, voice commands. In typical embodiments, a voice-activated remote control recognizes a first user command, sends a mute command to at least one source of sound, listens for a voice command, and then sends one or more signals to the at least one source of sound, so as to unmute that source.

Reference herein to "one embodiment", "an embodiment", or similar formulations, means that a particular feature, structure, operation, or characteristic described in connection with the embodiment, is included in at least one embodiment of the present invention. Thus, the appearances of such phrases or formulations herein are not necessarily all referring to the same embodiment. Furthermore, various particular features, structures, operations, or characteristics may be combined in any suitable manner in one or more embodiments.

Overview

An entertainment appliance, or consumer electronic product, that is very commonly paired with a remote control is a TV. It is noted that many other consumer electronic products, such as but not limited to, DVD players, TV set-top boxes, satellite receivers, stereos, and radios, may also be paired with a remote control. While each appliance may be paired with its own remote control, it is noted that some remote controls, sometimes referred to as universal remote controls, are operable to control two or more consumer electronic products.

In operation, a voice-activated, or voice-operated, remote control for an entertainment appliance must listen for a user's voice commands, and responsive thereto, generate and transmit the desired signals. A typical implementation of an infrared (IR) voice-operated remote control includes a microphone to receive, or hear, a user's voice commands, a processor to interpret those voice commands, and one or more IR emitter(s) to transmit control signals to the appliances under control of the remote.

A disadvantage of conventional implementations of voice-activated, or voice-operated, remote control devices is that the user is generally competing with background sounds, such as the sounds coming from a TV, or similar appliance that produces an audio output. In fact, there are two classes of problems that arise from the occurrence of background sounds. In a first situation, the remote control hears a sound originating from an appliance (e.g., a TV) that it determines to be a legitimate voice command, and consequently responds to that perceived voice command. In a second situation, a user speaks a voice command, but because the appliance is producing a loud background sound, the voice-operated remote control cannot understand the voice command spoken by the user.

To reduce, and possibly eliminate, the occurrence of these problems, a voice-operated remote control, in accordance with the present invention, is adapted to listen for a keyword, alternatively referred to as a trigger-word. Once the remote hears this special word, it then listens for the list of available voice commands for a short, predetermined period of time, for example three seconds. If in that predetermined time period a valid voice command is not recognized by the remote control, it then goes back to listening for the keyword. However, if in that predetermined time period, a valid voice command is recognized by the remote control, it will respond to the voice command and then go back to listening for the keyword.

In some embodiments, keywords are factory programmed into the voice-operated remote control. In alternative embodiments the keywords are programmed by a user. In a typical embodiment, the keywords are factory preprogrammed, and may be reprogrammed by a user.

Factory programmed keywords and factory programmed control commands are preset. In other words, a user must learn and use the voice commands that the factory has chosen. However, the user can train the voice-operated remote control to recognize the user's preferred keyword and voice commands. This user programmability makes the voice-operated remote control independent of language and accent since users can choose their own sounds to activate the various modes and features of the voice-operated remote control. Recognition accuracy for the person who trained the keyword and voice commands improves once the remote control is trained. Simultaneously, recognition accuracy decreases for all others. Consequently, the frequency of false positive responses goes down once the remote has been trained.

However the voice-operated remote control must still compete with the sound producing appliance, a TV in this illustrative description, even after a keyword is trained. To further increase recognition accuracy, an auto-mute feature is incorporated into the voice-operated remote control of the present invention. When auto-mute is enabled (typically by default), the voice-operated remote control will send out a mute command to the TV or entertainment appliance once the keyword is recognized. The TV is now quiet for the period of time (typically 3 seconds) that the voice-operated remote control is listening for the list of factory or user trained voice commands, thus increasing the likelihood of getting a valid command recognized. If a voice command is recognized during the auto-mute period, that recognized spoken command is executed and the TV is then unmuted. The auto-mute feature of the present invention may be implemented by sending the unmute command sequence, from the voice-operated remote control to a sound-producing appliance (e.g., a TV) before the recognized voice command is executed. Alternatively, the auto-mute feature of the present invention may be implemented by sending the unmute command sequence after the recognized voice command is executed. In this illustrative embodiment, if after the TV is muted, the remote does not recognize a valid voice command, then the TV is still unmuted.

In some embodiments, unmuting is accomplished by sending out a second mute command. Although this is a successful way to unmute many brands and models of TV, such a second transmission of the mute command can cause problems if the TV is "out of phase" with the state of muting. This is because the mute command for most televisions is a toggle. In other words, for a TV that is not in the mute state, when the mute command is transmitted, the TV is quieted, and when the mute command is transmitted again, the TV is unmuted. The same code both mutes and unmutes the television. Unfortunately, if the user pressed the mute button, and then uttered the auto-mute keyword, then the voice-operated remote control would send out a mute command, but rather than being quieted, the mute command sent by the voice-operated remote control as a result of executing the auto-mute function turns the sound back on. Then, after a predetermined period of time (e.g., 3 seconds) another mute is sent and the TV sound goes off. This situation may be referred to as the mute-phase problem.

To overcome the mute-phase problem described above, various embodiments of the present invention employ one or more of a variety of unmute strategies. Which strategy works best depends on what kind of TV system the user has. Most, but not all, makes, or brands, of TV will unmute the TV when the volume is adjusted. Therefore, simply sending a volume up command will work for these TVs with respect to the mute-phase problem, but this approach is problematic in that the TV will gradually get louder as the TV is muted and unmuted. Some embodiments of the present invention overcome this problem by alternately sending volume up and volume down commands each time the unmute sequence is executed. For example, at the conclusion of a first auto-mute session a volume up command is transmitted as the unmute sequence, and at the conclusion of the next auto-mute session, a volume down command is transmitted as the unmute sequence. It will be appreciated that the remote control may choose to begin with either the volume up or volume down commands, as long as these are alternated with each succeeding auto-mute session.

Notwithstanding the solutions to the mute-phase problem provided by the alternative embodiments described above, some televisions do not unmute when the volume is adjusted downwards. For these TVs the alternating volume up and volume down strategy will result in the TV only unmuting half the time and the TV's volume will gradually getting louder. A solution provided by some embodiments is to send out a macro consisting of a volume up followed by a volume down. In other words, to mute the TV, a single mute command is sent, but to unmute a volume up is sent immediately followed by sending a volume down. The volume up will unmute the television and raise the volume, and the volume down will adjust the volume to where it originally was.

Some televisions will unmute with a volume up but will not adjust the volume. For these TVs, the above-described macro approach will cause the TV to gradually get quieter as the remote is used. In other words, the volume up unmutes the TV but does not increase the volume, and the volume down lowers the volume to one notch below where it was before the TV was muted. For such televisions, a more complex unmute macro can be executed by a voice-operated remote control in accordance with the present invention. This unmute macro provides a mute command followed by a volume up, followed by a volume down. This macro solves the mute-phase problem, and works for most TVs. It is noted that such a sequence, i.e., three commands, takes longer to transmit than the other unmute sequences described above.

Some embodiments of the voice-operated remote control are adapted to notify the user that the remote is listening for a keyword (e.g., an auto-mute keyword) by illuminating a particular indicator. Keyword and command indicators are typically different colors or different indicators to more effectively communicate to a user whether the remote is listening for a keyword or listening for a command word. In further alternative embodiments, additional prompting is accomplished by aural means by allowing the remote to optionally make a specific brief sound when it hears a valid keyword so that the user does not have to be looking at the remote to use it.

ILLUSTRATIVE EMBODIMENTS

Referring to FIG. 1, a high level block diagram of a system including a voice-operated remote control 102, in accordance with the present invention, in wireless communication with an entertainment system 104 is shown. It can be seen that entertainment system 104 includes, or is coupled to a sound producing output device such as loudspeaker 106. In order to increase the effectiveness and accuracy of voice recognition of commands spoken by a user, voice-operated remote control 102 is adapted to provide an auto-mute function in accordance with the present invention. Typically, voice-operated remote control 102 initiates the auto-mute function responsive to receiving a predetermined, or preset, keyword. In some embodiments the initiation of the auto-mute function may be responsive to the detection of a mechanical actuation, for example the press of a button disposed on voice-operated remote control 102.

Figure 2:
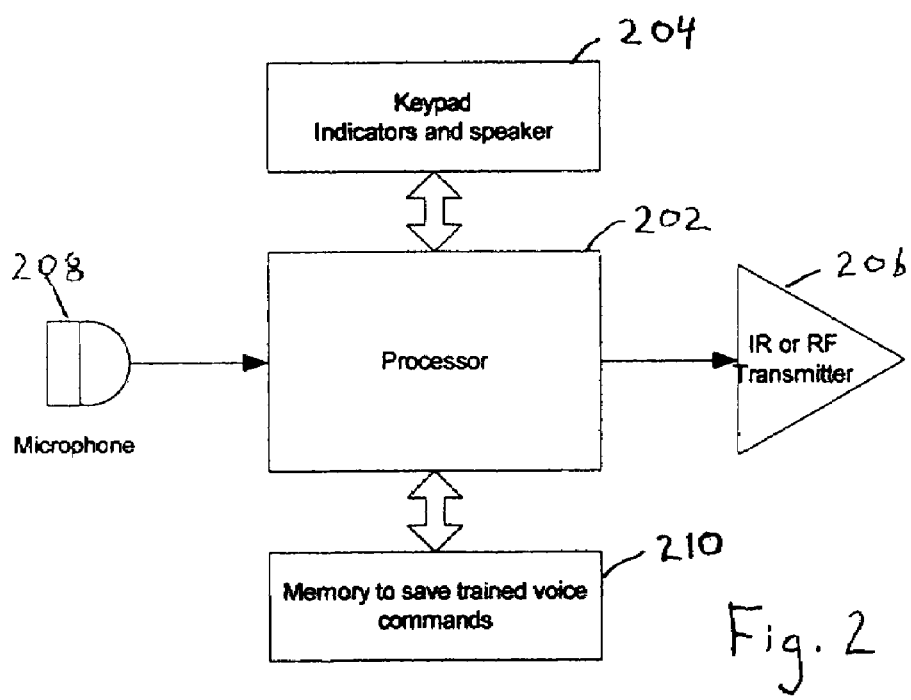
FIG. 2 is high level block diagram of voice-operated remote control, in accordance with the present invention.

FIG. 2 is high level block diagram of voice-operated remote control, in accordance with the present invention. A processor, or microcontroller, 202 provides the computational resources used in implementing the auto-mute function, as well as other functions. Processor 202 is typically a microcontroller with internal program memory. The circuits of the microcontroller taken together with the program stored in its memory form the computational resource that controls the operations of the auto-mute function of the present invention. Those skilled in the art will appreciate that the required computational resources may be provided in a variety of ways including, but not limited to, a microcontroller coupled to external program memory; a microprocessor coupled to one or more addressable blocks of memory; and logic circuits configured to implement the desired control functions. In the illustrative embodiment of FIG. 2, microcontroller 202 is coupled to an interface block 204 that includes a keypad, indicators (e.g., LEDs), and a speaker. Microcontroller 202 is coupled to a transmitter 206. It is noted that transmitter 206 may be an infra-red (IR) transmitter, or a radio frequency (RF) transmitter. In the illustrative embodiment of FIG. 2, microcontroller 202 is coupled to a microphone 208, and to an external block of memory 210 in which trained voice command patterns are stored.

Figure 3:
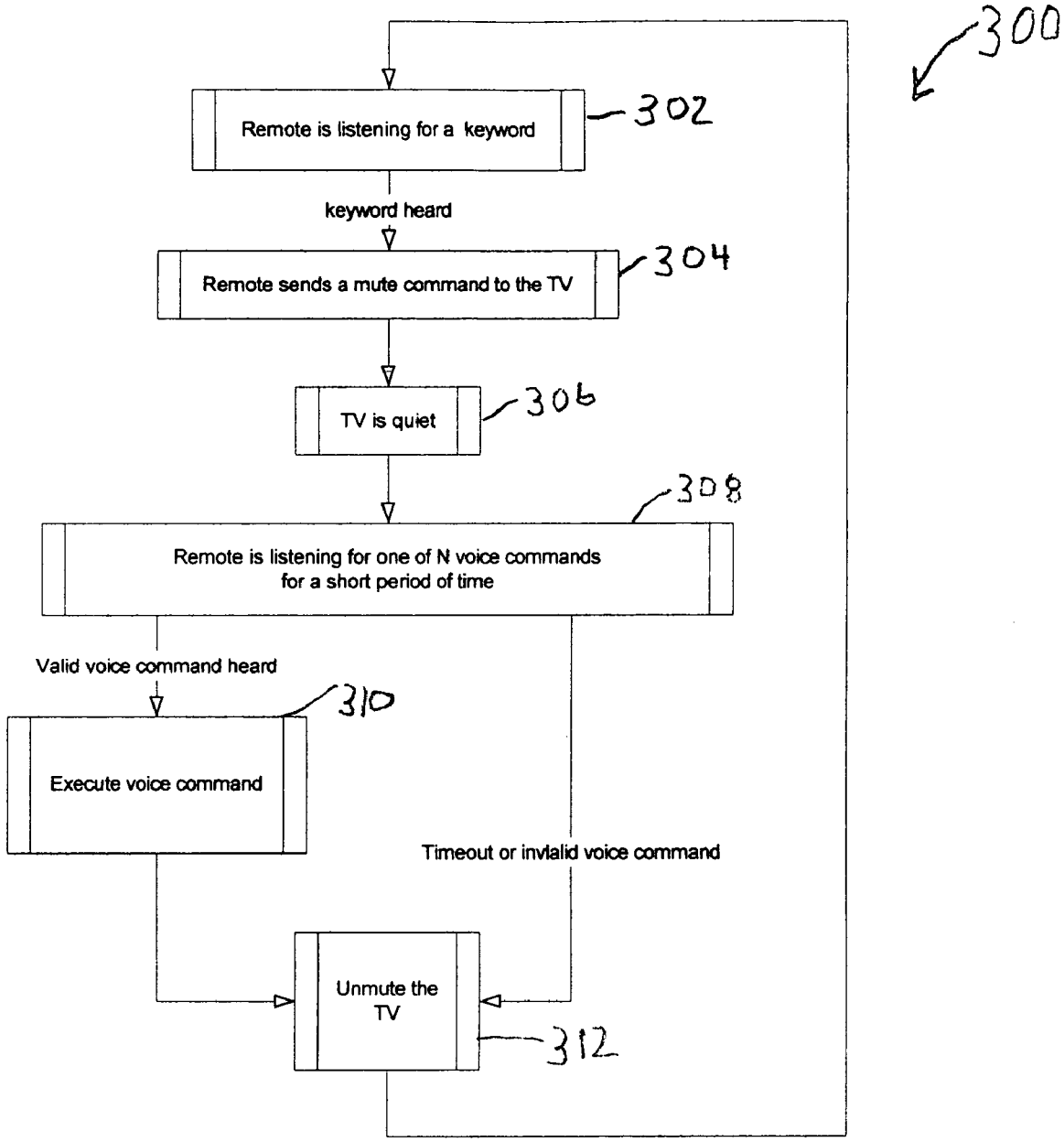
FIG. 3 is a flow diagram of an illustrative embodiment of the auto-mute function of the present invention.
Figure 4A:
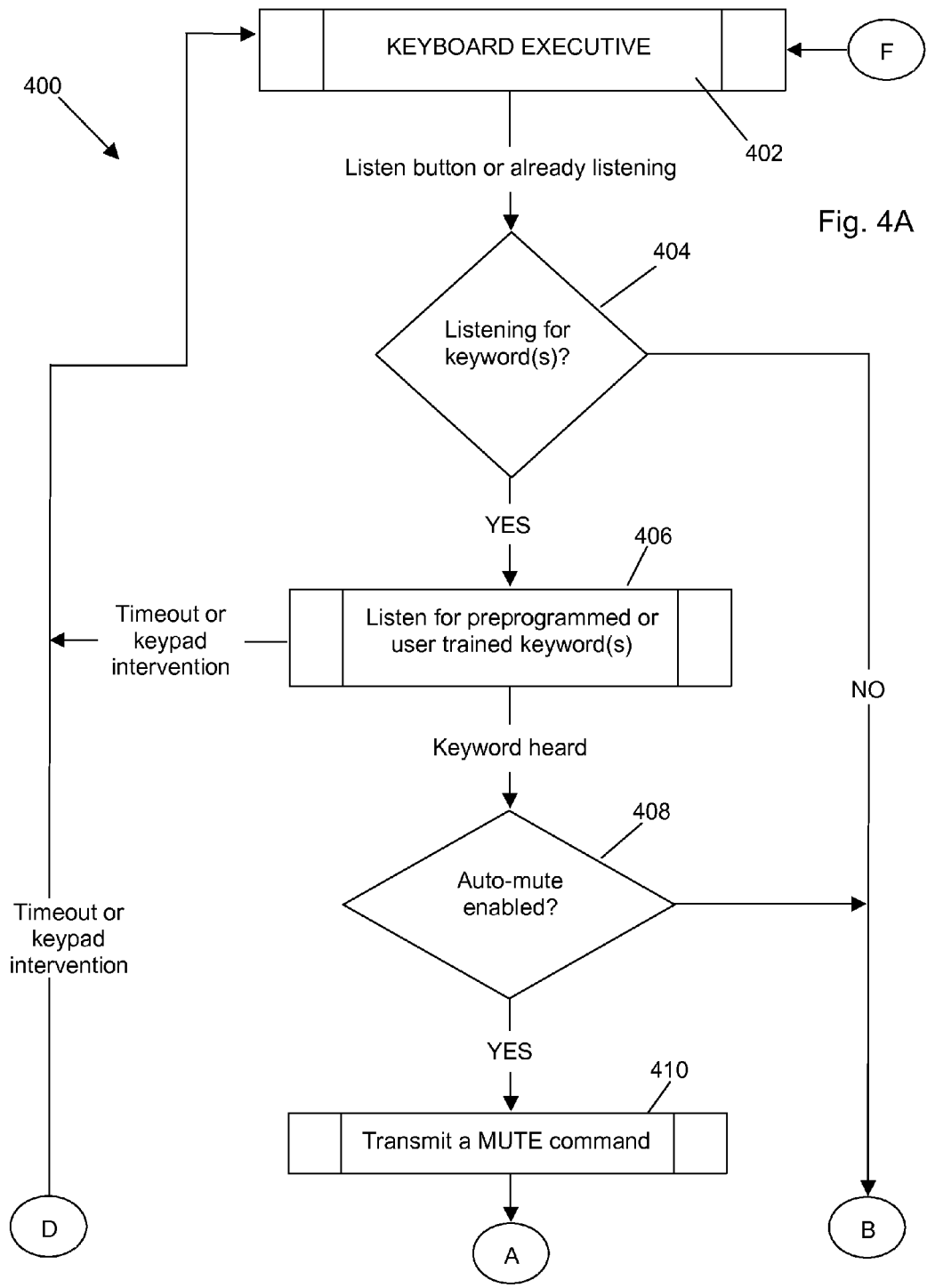
FIGS. 4A-4D show a flow diagram of an illustrative embodiment of the auto-mute function of the present invention.
Figure 4B:
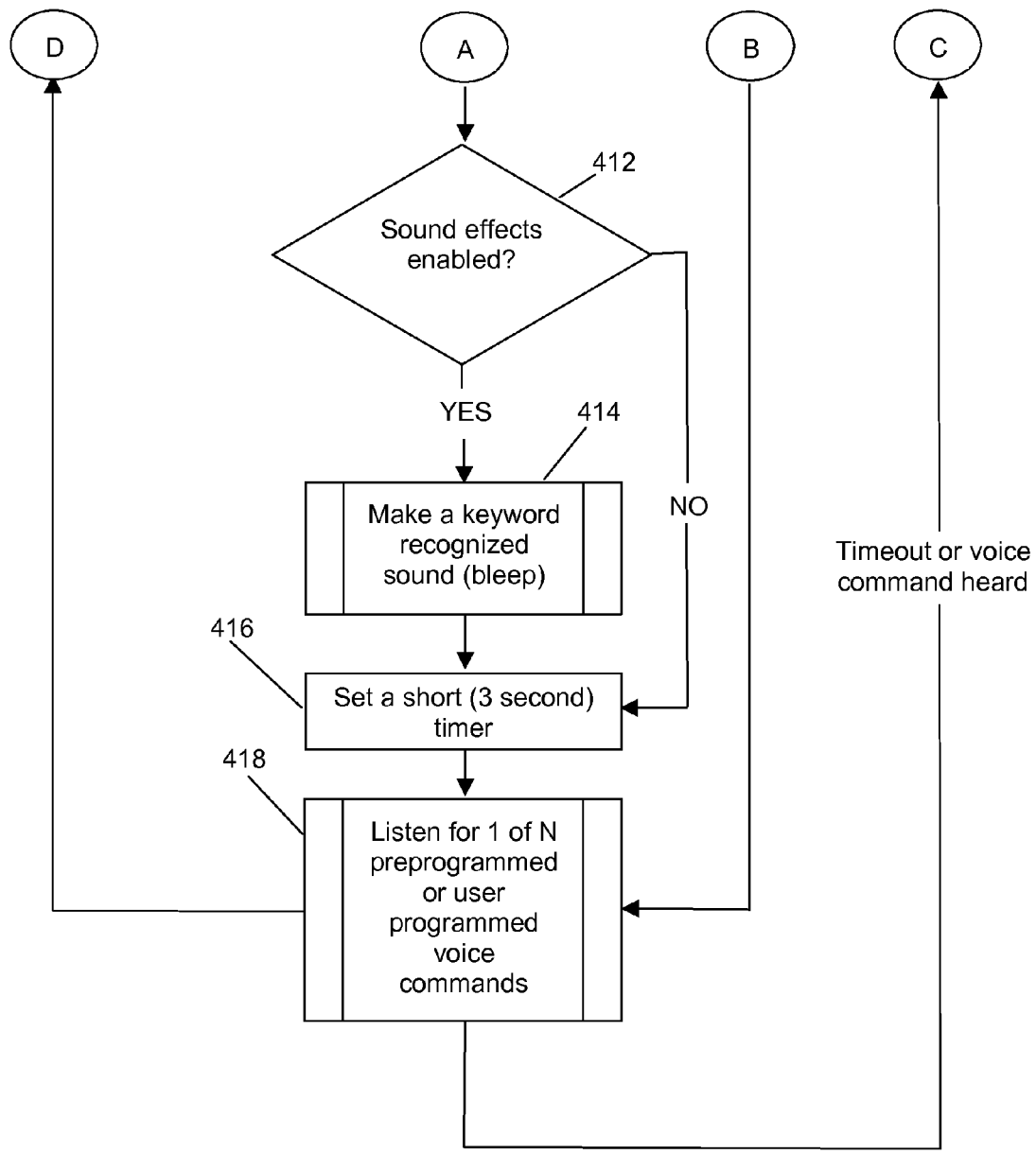
Figure 4C:
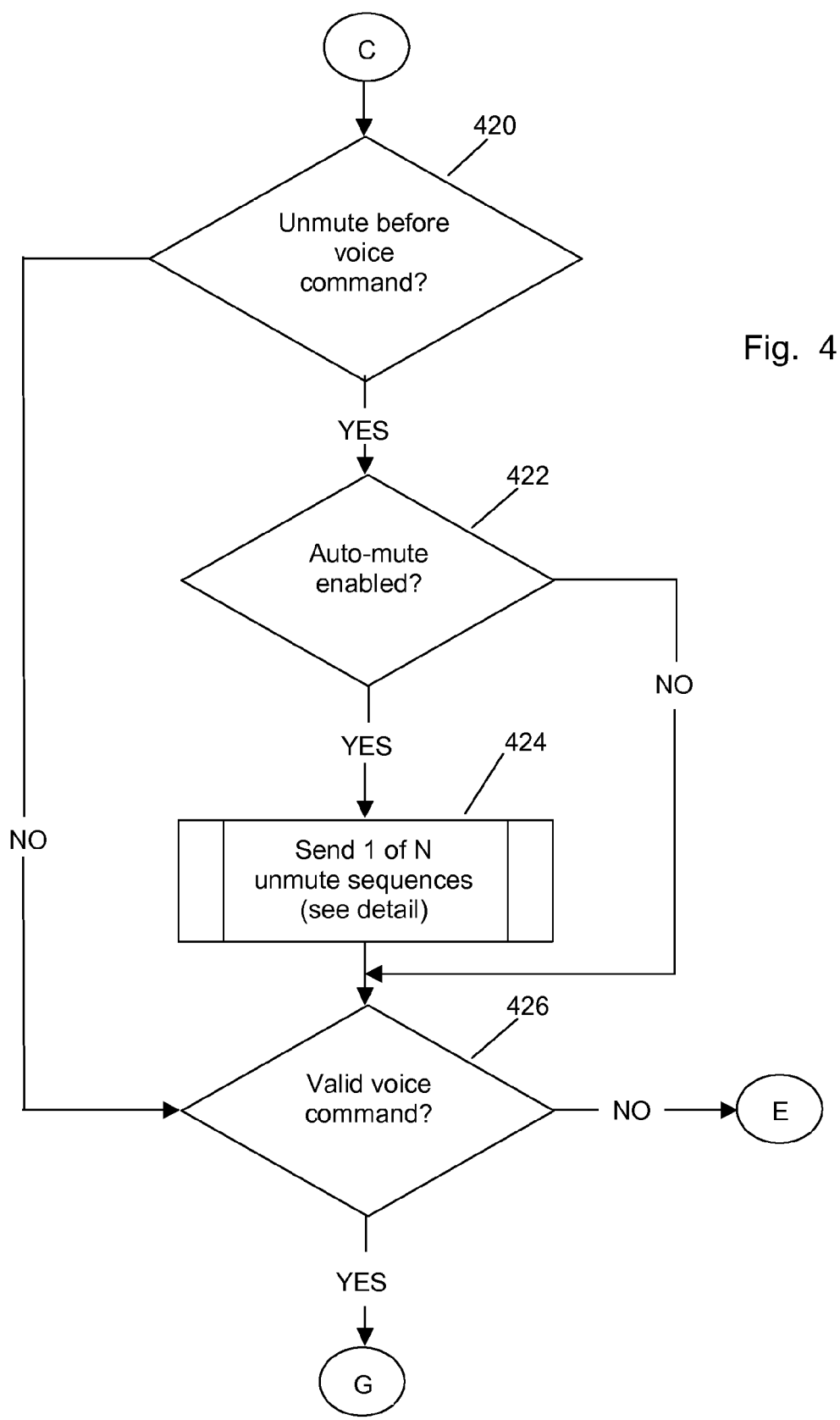
Figure 4D:
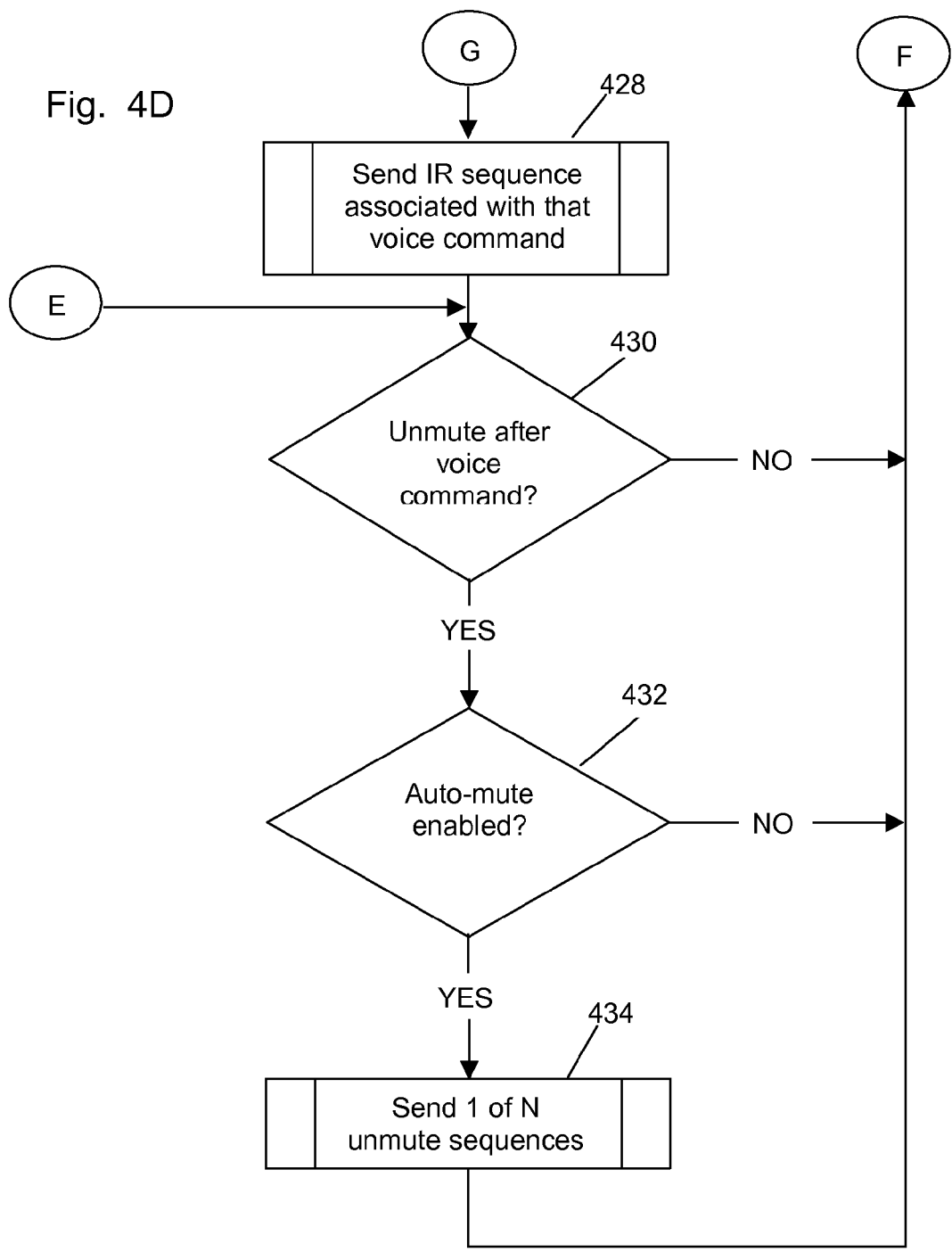

FIG. 3 illustrates an embodiment of the auto-mute process 300 in accordance with the present invention. Illustrative process 300 includes the voice-operated remote control listening 302 for a keyword that indicates that the auto-mute function should be initiated. When a determination has been made by the voice-operated remote control that a keyword intended to initiate the auto-mute sequence has been received, the remote control sends 304 a mute command to the TV. It is noted that although this illustrative embodiment deals with signals sent from a remote control to a TV, the invention applies more generally to the relation between a remote control and one or more entertainment appliances that are adapted for use with a remote control, such as, but not limited to CD players, DVD players, satellite receivers, TV set-top boxes, radios, and so on.

Still referring to FIG. 3, responsive to the mute command sent by the remote control, the TV is quieted 306. Although the typical scenario is to have the TV muted, i.e., the sound turned off completely, the present invention contemplates the situation in which various entertainment appliances, that in response to a mute command, or an alternative command, reduce their audio outputs to a lower level, but do not completely blank out their audio outputs. In alternative embodiments, the auto-mute sequence may further command the TV to display closed captioning for the duration of the auto-mute process.

Subsequent to the transmission of the mute command, the remote control listens 308 for any one of a predetermined plurality of voice commands. The remote control keeps track of time during this part of the auto-mute process. Those skilled in the art will appreciate that the implementation of timers within microcontroller systems is well-known, and is therefore not described in greater detail herein. It is noted that a timer may be started prior to, concurrent with, or subsequent to, the transmission of the mute command, as long as a predetermined amount of time is allowed prior to terminating the auto-mute process. In a typical embodiment, the remote control waits about three seconds between muting 304 and unmuting 312 the TV, if no valid voice command is received in that interval If the remote control determines, within a predetermined time interval, that a valid voice command was received, then that voice command is executed 310, and the TV is unmuted 312.

FIGS. 4A-4D show a flow diagram of an illustrative embodiment of an auto-mute function 400 in accordance with the present invention. More particularly, in the illustrative embodiment of FIG. 4, the remote control is in state that is managed by a "keyboard executive" routine that is executed 402 by the microcontroller. A determination is made 404 as to whether the remote control is to listen for keywords or voice commands. If the determination of 404 is affirmative then the remote control listens 406 for keywords. These keywords may be factory programmed keywords, user trained keywords, or both. If no keyword is validly detected within a predetermined period of time, then control returns to the keyboard executive 402. Similarly, control may be returned to the keyboard executive 402 if a button press is detected on the keypad of the remote control.

If an auto-mute keyword is detected, then a determination is made at 408 as whether the auto-mute function is enabled. If the determination at 408 is affirmative, then the remote control transmits 410 a mute command. A determination is then made 412 as to whether sound effects are enabled. If the determination at 412 is affirmative then the remote control generates a predetermined sound 414 to indicate that the keyword has been recognized.

A timer is started 416, which in this illustrative embodiment is nominally for three seconds. It is noted that this timer may be set to other values in other embodiments of the present invention. The remote control listens 418 for any one of a predetermined plurality of voice commands. It is noted that such voice commands may be programmed by the manufacturer, or may be user trained voice commands.

Still referring to FIGS. 4A-4D, if a voice command is detected at 418, then a determination is made 420 as to whether to transmit an unmute sequence prior to executing the voice command. If the determination of 420 is affirmative, then a determination is made at 422 as to whether the auto-mute function is enabled. If the determination of 422 is affirmative, then an appropriate unmute sequence is selected and transmitted 424. If the determination of either 420 or 422 is negative, then control passes to the determination at 426, without first sending an unmute sequence.

A determination is made at 426 as to whether a valid voice command has been received by the remote control. If the determination of 426 is affirmative, then the appropriate signals associated with the received voice command are transmitted 428 by the remote control. In this illustrative embodiment, the remote control communicates with the controlled appliance(s) by means of IR signals.

Subsequent to transmitting 428 the signals associated with received voice command, a determination is made 430 as to whether an unmute sequence should be transmitted after executing the voice command. If the determination of 430 is negative, then control is returned to the keyboard executive

402. If the determination of 430 is affirmative, then a determination is made 432 as to whether the auto-mute function is enabled. If the determination of 432 is negative, then control is returned to the keyboard executive 402. If the determination of 432 is affirmative, then an appropriate unmute sequence is selected and transmitted 434, and control is returned to the keyboard executive 402.

Figure 5:
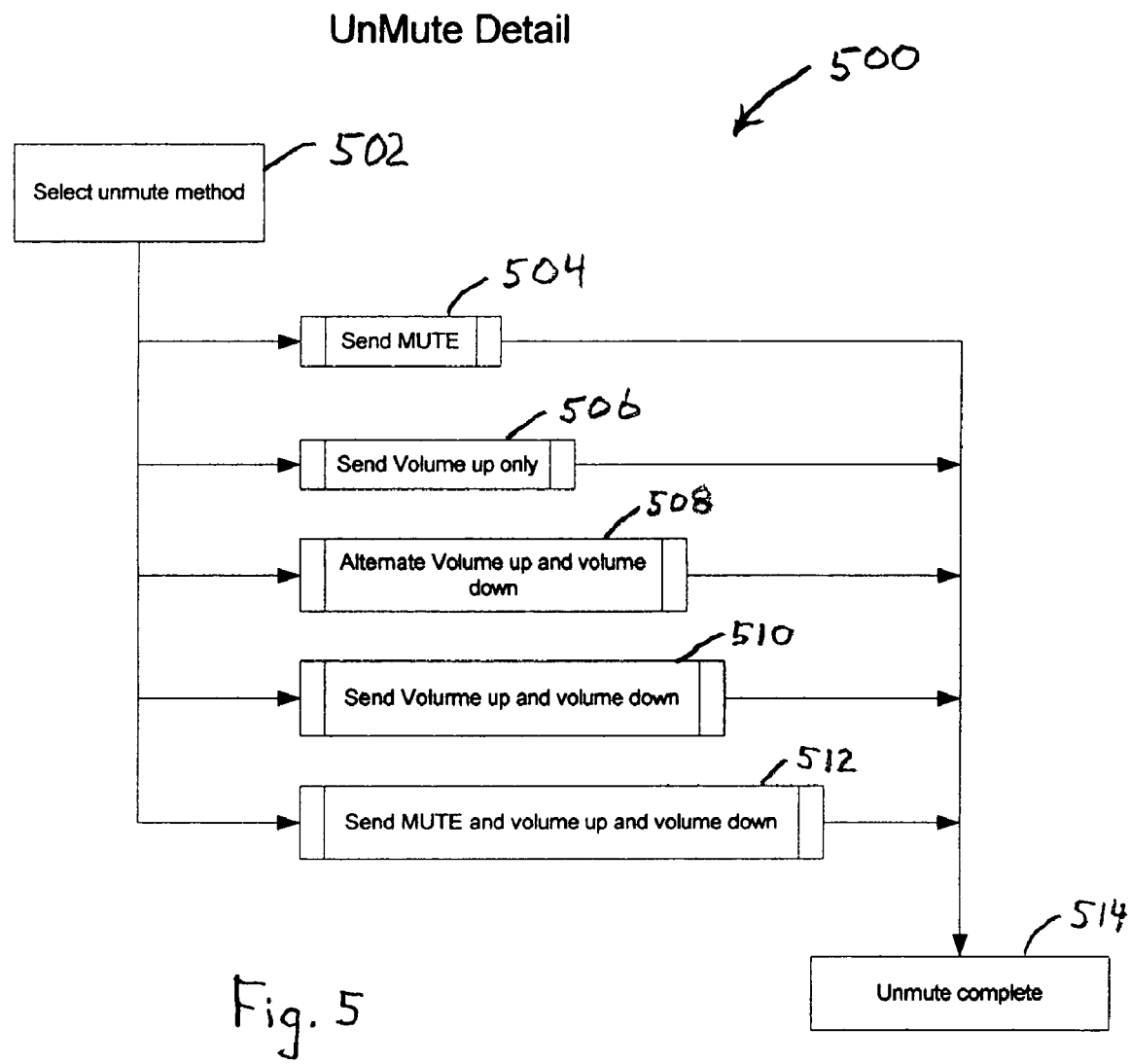
FIG. 5 is a flow diagram illustrating details of the unmute sequence selection and transmission operations of auto-mute process in accordance with the resent invention.

FIG. 5 is a flow diagram of an illustrative unmute sequence selection and transmission process 500 of the auto-mute operation in accordance with the present invention. As described in greater detail above, various entertainment appliances differ in their requirements for unmuting, therefore an appropriate unmute sequence is selected, based, at least in part, on the make and model of the entertainment appliance that is being controlled. When the auto-mute operation determines that it is appropriate to command the entertainment appliance to unmute, the illustrative embodiment of the present invention selects 502 one of several possible unmute sequences for transmission to the entertainment appliance. If a mute command is selected to unmute the appliance, then the mute command is transmitted 504. If a volume up command is selected to unmute the appliance, then the volume up command is transmitted 506. If an alternating volume up and volume down commands are being used to unmute the appliance, then whichever command was sent on the previous occurrence of the mute command, the other command of the pair is transmitted 508. If a volume up/volume down pair of commands is selected to unmute the appliance then the volume up/volume down pair of commands are transmitted 510. If a mute/volume up/volume down triplet of commands is selected to unmute the appliance then the mute/volume up/volume down triplet of commands are transmitted 5112. After transmission of the selected unmute sequence process 500 then ends at 514.

In an alternative embodiment of the present invention, a user may instruct the remote control (by voice command, mechanical actuation, or both) to use a particular one of the preprogrammed unmute sequences contained within the memory that is accessible to the microcontroller, or other computational resource. It will be appreciated that, in typical embodiments, the microcontroller is programmed to respond to a user command to perform the aforementioned selection.

In a further alternative embodiment, the remote control is adapted to receive and store additional unmute sequences. Such unmute sequences may be received in any suitable manner, including, but not limited to, receiving an IR transmission, receiving an RF transmission, receiving input via a keypad, and receiving input via a plug-in device, such as a memory stick.

In a still further alternative embodiment, the remote control is adapted to receive instructions for storing user-defined arbitrary key sequences for muting and/or unmuting as part of the auto-mute sequence.

CONCLUSION

Described herein are methods and apparatus for operating a voice-activated remote control, that include recognizing a command to enter an auto-mute state wherein the voice-activated remote transmits the signals needed to mute one or more sound-producing appliances, listens for a voice command from a user in the quieted environment, and subsequently unmutes the previously muted one or more appliances.

It is to be understood that the present invention is not limited to the embodiments described above, but encompasses any and all embodiments within the scope of the subjoined Claims and their equivalents.

What is claimed is:

1. A method of operating a voice-activated remote control, comprising:
    a) receiving, at the voice-activated remote control, a first audio input;
    b) determining, at the voice-activated remote control, whether the first audio input represents an auto-mute keyword;
    c) transmitting, from the voice-activated remote control, if the determination of (b) is affirmative, at least one mute command;
    d) determining, at the voice-activated remote control, subsequent to (c), whether a valid voice command is received within a predetermined period of time;
    e) executing, at the voice-activated remote control, if the determination of (d) is affirmative, the voice command received; and
    f) transmitting, from the voice-activated remote control, at least one unmute sequence;
    g) determining, at the voice-activated remote control, whether an immediately previous transmitted unmute sequence was the volume up command;
    h) transmitting, at the voice-activated remote control, if the determination of (g) is affirmative, a volume down command; and
    i) transmitting, at the voice-activated remote control, if the determination of (g) is negative, a volume up command.

2. The method of claim 1, wherein step (e) is performed prior to step (f).

3. The method of claim 1, wherein step (f) is performed prior to step (e).

4. The method of claim 1, further comprising determining, at the voice-activated remote control, prior to transmitting a mute command, whether an auto-mute mode is enabled.

5. A voice-operated remote control, comprising:
    a computational resource coupled to a microphone, a transmitter, a memory having trained voice command patterns stored therein, and further coupled to a keypad, indicators, and a speaker;
    wherein the computational resource is adapted to:
    a) receive a first audio input;
    b) determine whether the first audio input represents an auto-mute keyword;
    c) transmit, if the determination of (b) is affirmative, at least one mute command;
    d) determine, subsequent to (c), whether a valid voice command is received within a predetermined period of time;
    e) execute, if the determination of (d) is affirmative, the voice command received;
    f) determine whether an immediately previous transmitted unmute sequence was the volume up command;
    g) transmit, if the determination of (f) is affirmative, a volume down command; and
    h) transmit, if the determination of (f) is negative, a volume up command.

6. The voice-operated remote control of claim 5, wherein the computational resource is a microcontroller.

7. The voice-operated remote control of claim 5, wherein the computational resource is further adapted to determine, prior to transmitting a mute command, whether an auto-mute mode is enabled.

8. The voice-operated remote control of claim 7, wherein the computational resource is further adapted to select one of a plurality of unmute sequences, based, at least in part, on the make and model of an entertainment appliance to be controlled by the voice-activated remote control.

9. The voice-operated remote control of claim 7, wherein the unmute sequence consists of a mute command.

10. The voice-operated remote control of claim 7, wherein the unmute sequence consists of a volume up command.

11. The voice-operated remote control of claim 7, wherein the unmute sequence consists of a volume up command and a volume down command.

12. The voice-operated remote control of claim 7, wherein the unmute sequence consists of a mute command, a volume up command, and a volume down command.

13. The voice-operated remote control of claim 7, wherein the mute command includes signals necessary to command an entertainment appliance to completely turn off its sound output.

14. The voice-operated remote control of claim 7, wherein the mute command includes signals necessary to command an entertainment appliance to lower its sound output.

15. The voice-operated remote control of claim 7, wherein the mute command includes signals necessary to command an entertainment appliance to turn on a closed captioning display.

16. The voice-operated remote control of claim 7, further comprising means for receiving a user input, and responsive thereto, selecting one of a plurality of stored unmute sequences to be used by the auto-mute process.

17. The voice-operated remote control of claim 7, further comprising means for receiving a user input, and responsive thereto, storing additional unmute sequences.

18. The voice-operated remote control of claim 7, further comprising means for receiving a user input, and responsive thereto, storing user-defined arbitrary key sequences for muting and/or unmuting.

19. A method of operating a voice-activated remote control, comprising:
 a) receiving, at the voice-activated remote control, a first audio input;
 b) determining, at the voice-activated remote control, whether the first audio input represents an auto-mute keyword;
 c) transmitting, from the voice-activated remote control, if the determination of (b) is affirmative, a mute command;
 d) determining, at the voice-activated remote control, subsequent to transmitting the mute command, whether a valid voice command is received within a predetermined period of time;
 e) executing, at the voice-activated remote control, if the determination of (d) is affirmative, the voice command received; and
 f) transmitting subsequent to (c) in sequence, from the voice-activated remote control, a mute command, followed by a first volume change command, followed by a second volume change command;
wherein the first volume change command is a volume up command and the second volume change command is a volume down command; or
wherein the first volume change command is a volume down command and the second volume change command is a volume up command.

* * * * *